(12) United States Patent
Kim et al.

(10) Patent No.: US 11,500,027 B2
(45) Date of Patent: Nov. 15, 2022

(54) METHOD AND APPARATUS FOR TESTING SECONDARY BATTERY INTERNAL SHORT AND SECONDARY BATTERY USED THEREFOR

(71) Applicant: LG CHEM, LTD., Seoul (KR)

(72) Inventors: Soo-Han Kim, Daejeon (KR); Dong-Sik Yoon, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 2 days.

(21) Appl. No.: 16/960,579

(22) PCT Filed: Jun. 11, 2019

(86) PCT No.: PCT/KR2019/007007
§ 371 (c)(1),
(2) Date: Jul. 8, 2020

(87) PCT Pub. No.: WO2020/009343
PCT Pub. Date: Jan. 9, 2020

(65) Prior Publication Data
US 2020/0393517 A1    Dec. 17, 2020

(30) Foreign Application Priority Data

Jul. 4, 2018 (KR) ........................ 10-2018-0077791

(51) Int. Cl.
*G01R 31/3835* (2019.01)
*G01R 31/364* (2019.01)
(Continued)

(52) U.S. Cl.
CPC ....... *G01R 31/3835* (2019.01); *G01R 31/364* (2019.01); *G01R 31/3644* (2013.01);
(Continued)

(58) Field of Classification Search
CPC .............. G01R 31/3835; G01R 31/364; G01R 31/3644; G01R 31/52; G01R 31/389;
(Continued)

(56) References Cited

U.S. PATENT DOCUMENTS 4,282,292 A    8/1981 Stewart
5,460,902 A    10/1995 Parker et al.
(Continued)

FOREIGN PATENT DOCUMENTS

JP    2002-313859 A    10/2002
JP    2011-193614 A    9/2011
(Continued)

OTHER PUBLICATIONS

Extended European Search Report issued from the European Patent Office dated Feb. 26, 2021 in a corresponding European Patent Application No. 19830034.5.
(Continued)

*Primary Examiner* — Judy Nguyen
*Assistant Examiner* — Joseph O Nyamogo
(74) *Attorney, Agent, or Firm* — Morgan, Lewis & Bockius LLP

(57) ABSTRACT

Disclosed is a method and apparatus for testing an internal short of a secondary battery by simulating the use environment situation where the secondary battery is actually used, and a secondary battery for an internal short test, which is used in the method. The method for testing an internal short of a secondary battery includes the steps of mounting a P-N junction diode in a secondary battery; charging the secondary battery; and evaluating a state of the secondary battery by considering that an internal short occurs in the secondary battery when the P-N junction diode is switched on.

12 Claims, 6 Drawing Sheets

(51) Int. Cl.
*G01R 31/36* (2020.01)
*H01M 10/42* (2006.01)
*H01M 10/48* (2006.01)
*G01R 31/52* (2020.01)

(52) U.S. Cl.
CPC ........ *G01R 31/52* (2020.01); *H01M 10/4285* (2013.01); *H01M 10/486* (2013.01)

(58) Field of Classification Search
CPC .......... H01M 10/4285; H01M 10/486; H01M 10/052; H01M 10/4257; H01M 10/44; H01M 10/48; Y02E 60/10
See application file for complete search history.

(56) References Cited

U.S. PATENT DOCUMENTS

| | | | | |
|---|---|---|---|---|
| 5,496,654 A | * | 3/1996 | Perkins | H01M 10/46 429/1 |
| 6,297,615 B1 | | 10/2001 | Crass | |
| 2002/0052055 A1 | | 5/2002 | Nikawa | |
| 2006/0038534 A1 | | 2/2006 | Chang et al. | |
| 2007/0009803 A1 | | 1/2007 | Kim et al. | |
| 2009/0202890 A1 | | 8/2009 | Takeda et al. | |
| 2010/0209767 A1 | | 8/2010 | Kasamatsu et al. | |
| 2012/0045673 A1 | * | 2/2012 | Lee | H01M 10/488 429/92 |
| 2014/0154535 A1 | * | 6/2014 | Olsson | H01M 50/394 429/53 |
| 2017/0338524 A1 | * | 11/2017 | Lin | H01M 10/4235 |

FOREIGN PATENT DOCUMENTS

| | | |
|---|---|---|
| JP | 2017-182976 A | 10/2017 |
| KR | 10-0247905 B1 | 5/2000 |
| KR | 10-2007-0005341 A | 1/2007 |
| KR | 10-2009-0130412 A | 12/2009 |
| KR | 10-2013-0075953 A | 7/2013 |

OTHER PUBLICATIONS

International Search Report (with partial translation) and Written Opinion issued in corresponding International Patent Application No. PCT/KR2019/007007, dated Sep. 23, 2019.

* cited by examiner

FIG. 6
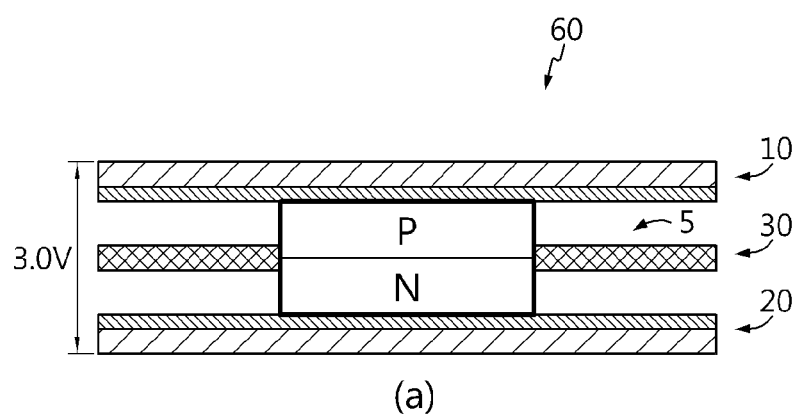
(a)
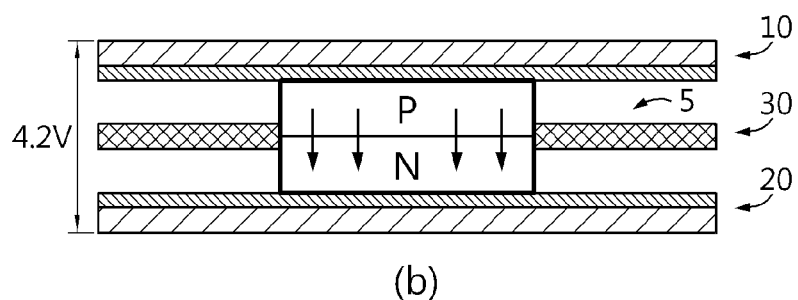
(b)

METHOD AND APPARATUS FOR TESTING SECONDARY BATTERY INTERNAL SHORT AND SECONDARY BATTERY USED THEREFOR

TECHNICAL FIELD

The present disclosure relates to a method and apparatus for evaluating safety of a secondary battery, and more particularly, to a method and apparatus for testing an internal short of a secondary battery. The present application claims priority to Korean Patent Application No. 10-2018-0077791 filed on Jul. 4, 2018 in the Republic of Korea, the disclosures of which are incorporated herein by reference.

BACKGROUND ART

As technology development and demand for mobile devices, electric vehicles, power storage devices and uninterruptible power supply devices increase, the demand for secondary batteries as energy sources to meet high power and high capacity demands is rapidly increasing. Accordingly, a secondary battery capable of coping with various demands is being studied. Among the major research subjects on the secondary battery, it is most important to improve the performance of the secondary battery by improving an energy density and improve the safety of secondary battery.

The secondary battery includes a separator between a positive electrode plate and a negative electrode plate. The separator is easily shrunk. For this reason, if the secondary battery is maintained in an extremely high temperature environment for a long time, an internal short may occur due to physical contact between the positive electrode plate and the negative electrode plate. In addition, the separator is destroyed by conductive powder adhering to the surface of the positive electrode plate or the negative electrode plate or by lithium metal extracted from the negative electrode plate, which may electrically connect the positive electrode plate and the negative electrode plate and thus cause an internal short. Also, an internal short may occur due to an impact from the outside of the secondary battery.

Once an internal short occurs, the short circuit portion may be further enlarged due to Joule heat accompanied with the short circuit current to generate abnormal heating, which may destroy the battery. If an internal short occurs as above, the high electric energy stored in each electrode plate is instantly conducted, which may has very high risk of explosion, unlike other safety accidents such as overcharge or overdischarge.

Because of this, the internal short need to be managed with care. It is important to prevent the internal short from occurring in the secondary battery, and, even when the internal short occurs in the secondary battery, it is also important to suppress the destruction as described above and to ensure safety. In addition, if the performance of the secondary battery is increased, the amount of intrinsic energy is also increased, and the potential for accident increases as much. For this purpose, it is further required to develop a technique for increasing the safety of the secondary battery when an internal short occurs.

Meanwhile, in order to ensure the battery safety even when an internal short occurs in the secondary battery, it is very important to correctly evaluate whether the safety is secured against the internal short during the battery designing stage or after the battery manufacturing. The secondary battery safety evaluation items related to the internal short at the present include a compression test that simulates a case where an internal short occurs in the battery due to external pressure, a collision test that simulates a case where fire or explosion occurs in the battery due to an internal short when the battery is impacted by a rod, a penetration test that simulates a case where an internal short occurs since the battery is penetrated by a nail when being packaged and transported, similar to the collision test, a thermal exposure (heating) test that evaluates the ability of the battery to endure a temperature atmosphere to which the battery is exposed when the ambient temperature rises abnormally, and so on.

However, these tests are subject to applying a strong physical force to the secondary battery from the outside, which simulate abnormal situations. In addition, since energy is applied from the outside, there is a limit in simulating the use environment situation where the secondary battery is actually used.

DISCLOSURE

Technical Problem

The present disclosure is designed to solve the problems of the related art, and therefore the present disclosure is directed to providing a method and apparatus for testing an internal short of a secondary battery by simulating the use environment situation where the secondary battery is actually used.

The present disclosure is also directed to providing a secondary battery for an internal short test, which may be used for the above internal short testing method.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a method for testing an internal short of a secondary battery, comprising: mounting a P-N junction diode in a secondary battery; charging the secondary battery; and evaluating a state of the secondary battery by considering that an internal short occurs in the secondary battery when the P-N junction diode is switched on.

The P-N junction diode may be mounted such that one surface thereof is in contact with a positive electrode plate of the secondary battery and the other surface thereof is in contact with a negative electrode plate of the secondary battery.

At this time, the P-N junction diode may be mounted between the positive electrode plate and the negative electrode plate of the secondary battery through a separator of the secondary battery.

The secondary battery may be charged to a full-charge voltage by using that the P-N junction diode has a threshold voltage ($V_{th}$) that corresponds to the full-charge voltage of the secondary battery.

As another example, the secondary battery may be charged to an experiment target voltage by using that the P-N junction diode has a threshold voltage ($V_{th}$) that corresponds to the experiment target voltage selected in a range between a full-discharge voltage and a full-charge voltage of the secondary battery.

In addition, the voltage and temperature of the secondary battery may be measured while charging continues. The voltage of the secondary battery is measured to check whether or not to reach the charge and discharge voltage and to check an electrochemical operation state. The temperature of the secondary battery is measured to check a physical operation state.

The step of mounting the P-N junction diode inside the secondary battery is to disassemble the assembled secondary battery, mount the P-N junction diode thereto and then reassemble the secondary battery, or to assemble the secondary battery to include the P-N junction diode therein from the beginning.

In order to perform the method for testing an internal short of a secondary battery according to the present disclosure, the secondary battery for an internal short test as follows may be used. The secondary battery for an internal short test comprises a positive electrode plate; a negative electrode plate; a separator interposed between the positive electrode plate and the negative electrode plate; a P-N junction diode mounted between the positive electrode plate and the negative electrode plate through the separator; and electrode leads connected to the positive electrode plate and the negative electrode plate.

In the secondary battery for an internal short test, the P-N junction diode may be mounted such that one surface thereof is in contact with the positive electrode plate of the secondary battery and the other surface thereof is in contact with the negative electrode plate of the secondary battery.

Preferably, a P-type semiconductor region of the P-N junction diode is in contact with the positive electrode plate, and an N-type semiconductor region is in contact with the negative electrode plate. An additional element may be further included between the P-type semiconductor region and the positive electrode plate and between the N-type semiconductor region and the negative electrode plate to electrically connect them while reducing electric contact resistance therebetween. Preferably, the secondary battery for an internal short test may further comprise a contact layer interposed between the P-N junction diode and the positive electrode plate and between the P-N junction diode and the negative electrode plate.

Also, the P-N junction diode may have a threshold voltage ($V_{th}$) corresponding to a full-charge voltage of the secondary battery that includes the positive electrode plate, the negative electrode plate and the separator.

As another example, the P-N junction diode may have a threshold voltage ($V_{th}$) corresponding to an experiment target voltage selected in a range between a full-discharge voltage and a full-charge voltage of the secondary battery that includes the positive electrode plate, the negative electrode plate and the separator.

In another aspect of the present disclosure, there is also provided an apparatus for testing an internal short of a secondary battery, comprising: an explosion-proof chamber in which the secondary battery for an internal short test as described above is loaded; a power supply connected to an electrode of the secondary battery for an internal short test to apply a charging current thereto; and a measuring instrument connected to the electrode of the secondary battery for an internal short test to measure a voltage and configured to measure a temperature of the secondary battery for an internal short test.

Advantageous Effects

The internal short testing method according the present disclosure does not simulate abnormal situations, different from the compression test, the collision test, the penetration test and the thermal exposure (heating) test of the prior art, and also does not simulate a situation where an energy is applied from the outside other than a charging current. Thus, according to the present disclosure, it is possible to cause an internal short under conditions similar to use environments where the secondary battery is actually used, and thus evaluate the safety of the secondary battery at that time.

The internal short testing method according to the present disclosure may be used during the battery designing state or after the verification stage after assembling. Since the state of the secondary battery is evaluated in a state where the internal short situation of the secondary battery is accurately simulated, it is possible to conduct a practical safety evaluation on the battery design and also to verify and modify new design criteria.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 6 is a diagram showing the change of an internal situation of the secondary battery as the secondary battery for an internal short test is charged.

BEST MODE

Hereinafter, preferred embodiments of the present disclosure will be described in detail with reference to the accompanying drawings. However, the embodiments according to the present disclosure may be modified in various ways, and the scope of the present disclosure should not be construed as being limited to the following embodiments. The embodiments of the present disclosure are provided to more fully describe the present disclosure to those skilled in the art.

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
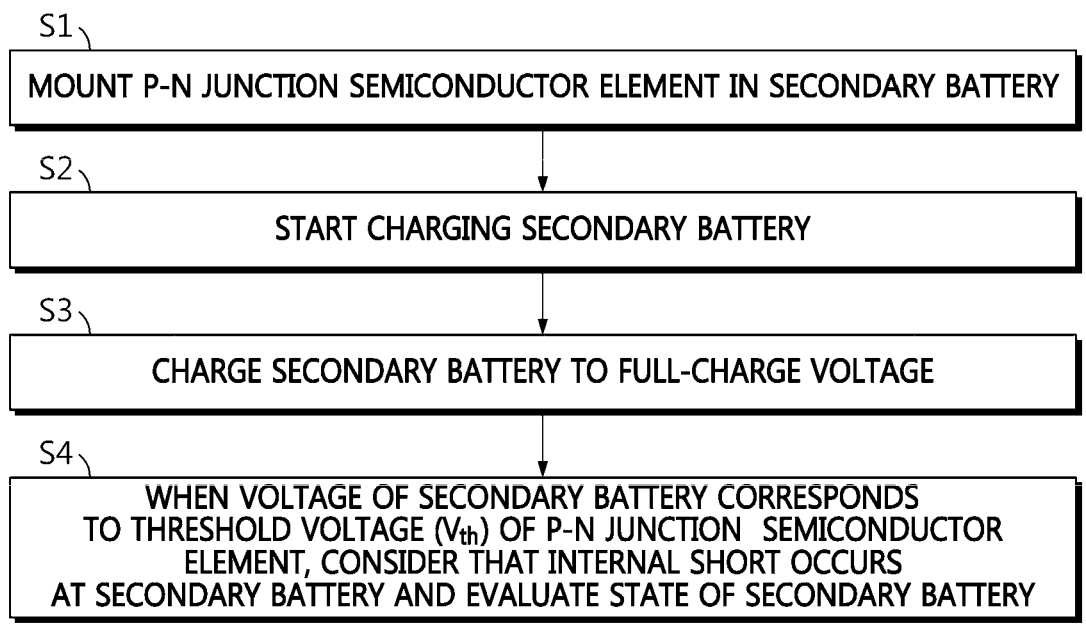
FIG. 1 is a flowchart for illustrating a method for testing an internal short of a secondary battery according to an embodiment of the present disclosure.

FIG. 1 is a flowchart for illustrating a method for testing an internal short of a secondary battery according to an embodiment of the present disclosure.

Referring to FIG. 1, a P-N junction diode is mounted in a secondary battery (Step s1).

Figure 2:
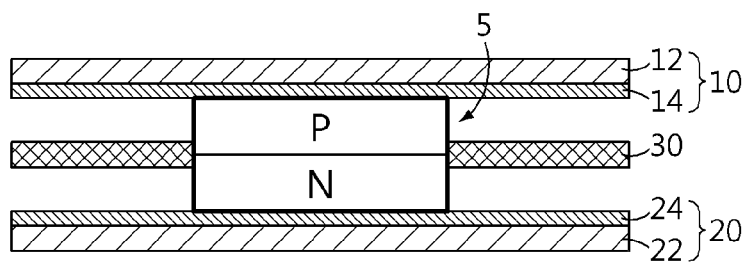
FIG. 2 schematically shows a state where a P-N junction diode is mounted in the secondary battery.

The state where the P-N junction diode is mounted in the secondary battery may be found in FIG. 2. Referring to FIG. 2, inside the secondary battery including a separator 30 between a positive electrode plate 10 and a negative electrode plate 20, a P-N junction diode 5 is mounted between the positive electrode plate 10 and the negative electrode plate 20. The positive electrode plate 10 is prepared by forming a positive electrode active material layer 14 on a positive electrode current collector 12. The negative electrode plate 20 is prepared by forming a negative electrode active material layer 24 on a negative electrode current collector 22. The P-N junction diode 5 is preferably mounted so that its one surface contacts the positive electrode plate 10 and the other surface contacts the negative electrode plate 20. At this time, the P-N junction diode 5 is preferably mounted between the positive electrode plate 10 and the negative electrode plate 20 through the separator 30.

In general, the P-N junction diode is basically prepared by joining a P-type semiconductor and an N-type semiconductor and has one P-N junction as a form of a most basic semiconductor element. The P-N junction diode is well known to form a one-directional current path only above a threshold voltage ($V_{th}$). As representative examples of the P-N junction diode, there are known germanium diodes, selenium diodes, silicon diodes and gallium arsenide diodes.

Figure 3:
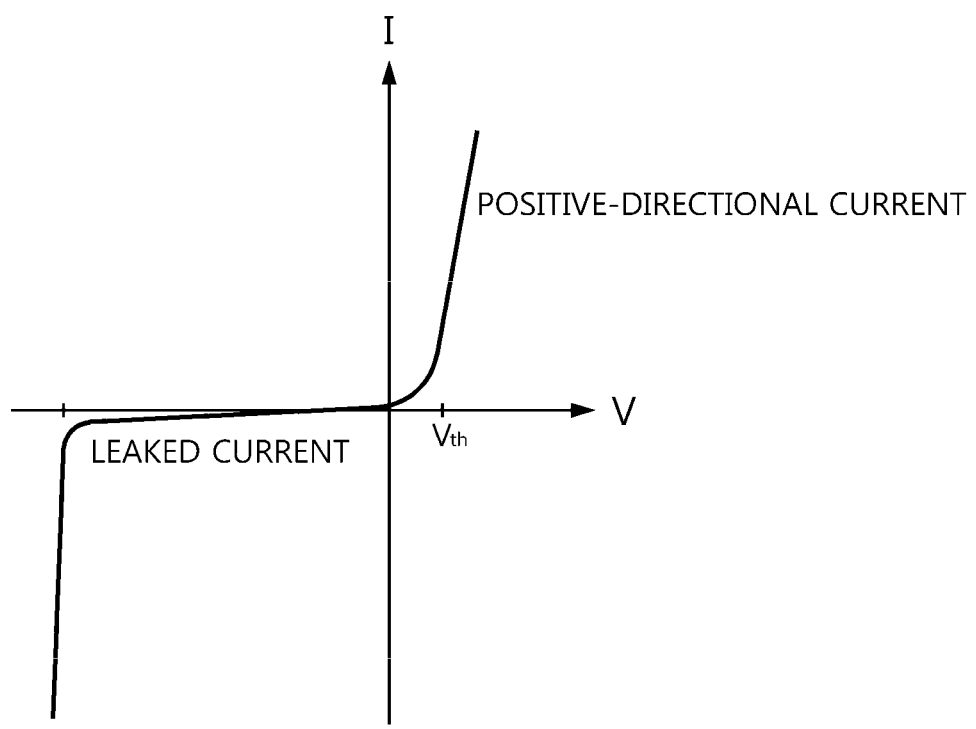
FIG. 3 is an I-V graph showing a threshold voltage ($V_{th}$) of the P-N junction diode.

FIG. 3 is an I-V graph showing the threshold voltage ($V_{th}$) of the P-N junction diode, which depicts a threshold voltage of a common commercial silicon diode as an example.

Referring to FIG. 3, if a positive-directional bias (+V) is applied is applied to the commercial silicon diode, a current flows. In particular, if the voltage reaches about 0.7V that is the threshold voltage ($V_{th}$), a positive-directional current rapidly increases. In the negative-directional bias (−V), there is only a small leakage current (until the breakdown occurs) and no current flows. In other words, the current flows well at the positive-directional voltage above the threshold voltage ($V_{th}$), and if the negative-directional voltage is applied, only a very small leakage current flows, and if the voltage reaches the breakdown voltage, the negative-directional current flows. Other types of P-N junction diodes exhibit similar I-V behavior to the commercial silicon diode, even though their threshold voltages are different.

In general, the P-N junction diode controls the depletion region at the junction of the P-type semiconductor region and the N-type semiconductor region by adjusting the doping concentration of the P-type and N-type semiconductor regions formed at the substrate, thereby setting the threshold voltage ($V_{th}$) at a desired level. If the doping concentration increases, the threshold voltage tends to increase. The threshold voltage also changes depending on the material properties of the substrate itself. For example, a gallium arsenide diode has a higher threshold voltage than the silicon diode.

The secondary battery has an upper limit that allows to be physically charged and a lower limit that allows to be physically discharged. However, in the actual use environment, the secondary battery is not charged and discharged up to the upper and lower physical limits. Instead, a use range is appropriately set within the upper and lower limits of the secondary battery in view of safety, lifespan and energy efficiency of the secondary battery, and the secondary battery is charged and discharged only within the use range. That is, the lower limit of the use range is set higher than a physical discharge limit point, and the upper limit of the use range is set lower than a physical charge limit point. The use range may be set variously according to the characteristics of the secondary battery, the use environments, the required charge/discharge capacity, the energy output, and the like. If the state of the secondary battery reaches the lower limit of the set use range while the secondary battery is being charged, this means that the secondary battery is completely discharged or fully discharged. In addition, if the state of the secondary battery reaches the upper limit of the set use range while the secondary battery is being charged, this means that the secondary battery is completely charged or fully charged. The full-charge voltage refers to the battery voltage when the state of the secondary battery reaches the upper limit of the set use range in the charging process of the secondary battery. Depending on the specification of the secondary battery, the full-discharge voltage and the full-charge voltage may vary, and, for example, the full-charge voltage may be 4.2V.

In a preferred embodiment, the threshold voltage ($V_{th}$) of the P-N junction diode may have a value corresponding to the full-charge voltage of the secondary battery that is to be tested.

The secondary battery that is to be tested may be in a full-discharge state since it is freshly assembled, or may be partially discharged since it is being tested or used. Thus, the secondary battery at the beginning of charging (for the internal short test) may or may not have a full-discharge voltage. The freshly assembled battery has a voltage of 0V, but the full-discharge voltage may not be 0V but be any value between 0V and the full-discharge voltage, for example 2.1V, depending on the set use range. In any case, the threshold voltage ($V_{th}$) of the P-N junction diode may have a value corresponding to the full-charge voltage of the secondary battery that is to be tested.

As another example, the threshold voltage ($V_{th}$) of the P-N junction diode may have a value corresponding to an experiment target voltage selected within the range between the full-discharge voltage and the full-charge voltage of the secondary battery that is to be tested. For example, in addition to testing an internal short at full-charge voltage, it may also be necessary to test an internal short within the use range of the secondary battery. For example, even though the full-charge voltage is 4.2V, it may also be necessary to test an internal short at 3.4V, which is a battery voltage within the use range. In this case, the P-N junction diode may have the threshold voltage ($V_{th}$) of 3.4V. Since the battery voltage at the lower end of the use range is the full-discharge voltage and the battery voltage at the upper end of the use range is the full-charge voltage, if an internal short is tested within the use range, an experiment target voltage within the range between the full-discharge voltage and the full-charge voltage of the secondary battery that is to be tested, and the threshold voltage ($V_{th}$) of the P-N junction diode has a value corresponding thereto.

The P-N junction diode having a desired threshold voltage ($V_{th}$) may be prepared by controlling substrate material, impurity type, doping concentration, or the like. The P-N junction diode 5 is as above and mounted inside the secondary battery as shown in FIG. 2. In this state, Step s1 is executed.

Preferably, the P-type semiconductor region of the P-N junction diode 5 is in contact with the positive electrode plate 10, and the N-type semiconductor region is in contact with the negative electrode plate 20. An additional element may be further included between the P-type semiconductor region and the positive electrode plate 10 and between the N-type semiconductor region and the negative electrode plate 20 to electrically connect each other while reducing electrical contact resistance. For example, an ohmic contact layer for electrical connection may be further included as an element that does not affect the battery performance of the secondary battery. Preferably, the ohmic contact layer may include at least one of Ni, Pt, Pd, Rh, W, Ti, Al, Ag, and Au.

In Step s1, the assembled secondary battery may be disassembled and then reassembled after the P-N junction diode 5 is mounted thereto. Alternatively, the secondary battery may be assembled such that the P-N junction diode 5 is included therein from the beginning. The secondary battery including the P-N junction diode 5 therein is a secondary battery for an internal short test according to the present disclosure, and the secondary battery will be described in more detail after the internal short testing method is described.

If the secondary battery is prepared by performing Step s1, it is initiated to charge the secondary battery (Step s2). In FIG. 1 and the following description on the method, it will be explained mainly based on the case where the threshold voltage ($V_{th}$) of the P-N junction diode has a value corresponding to the full-charge voltage of the secondary battery. However, the above method is applied identically to the case where the threshold voltage ($V_{th}$) of the P-N junction diode has a value corresponding to the experiment target voltage within the use range of the secondary battery.

The secondary battery is charged by connecting a charging power supply to the secondary battery and proceeding according to a set charging protocol, for example as CC-CV charging. If the secondary battery is charged, the voltage increases.

After that, charging is continued until the voltage of the secondary battery reaches the full-charge voltage (Step s3). If the threshold voltage ($V_{th}$) of the P-N junction diode has a value corresponding to the experiment target voltage, the charging may be continued until the experiment target voltage is reached.

While charging continues, the voltage and temperature of the secondary battery may be measured. The voltage of the secondary battery is measured to check whether the charge and discharge voltage is reached and to check an electrochemical operation state. The measurement may be performed using a current-voltage measurer. The temperature of the secondary battery is measured to check a physical operation state. The measurement may be performed using a thermocouple or the like.

If the P-N junction diode 5 is switched on as a result of continued charging, it is regarded that an internal short occurs at the secondary battery, and the state of the secondary battery is evaluated (Step s4).

If the voltage of the secondary battery is equal to the threshold voltage ($V_{th}$) of the P-N junction diode as the secondary battery is charged, as shown in FIG. 3, a large positive-directional current flows instantly through the P-N junction diode 5. As the P-N junction diode 5 is switched on so that a large current flows, positive electrode plate 10 and the negative electrode plate 20 are electrically connected, which is identical to the internal short situation.

According to the present disclosure, the internal short situation may be simulated by only charging like an actual battery use state, without applying an energy such as shock or heat from the outside. In other words, without applying a strong physical force or applying an energy other than the charging current to the secondary battery from the outside, the internal short situation may be naturally generated according due to charging. As described above, according to the present disclosure, an internal short may be generated by simulating an actual battery use environment situation, without simulating an abnormal situation such as a physical shock from the outside.

Figure 4:
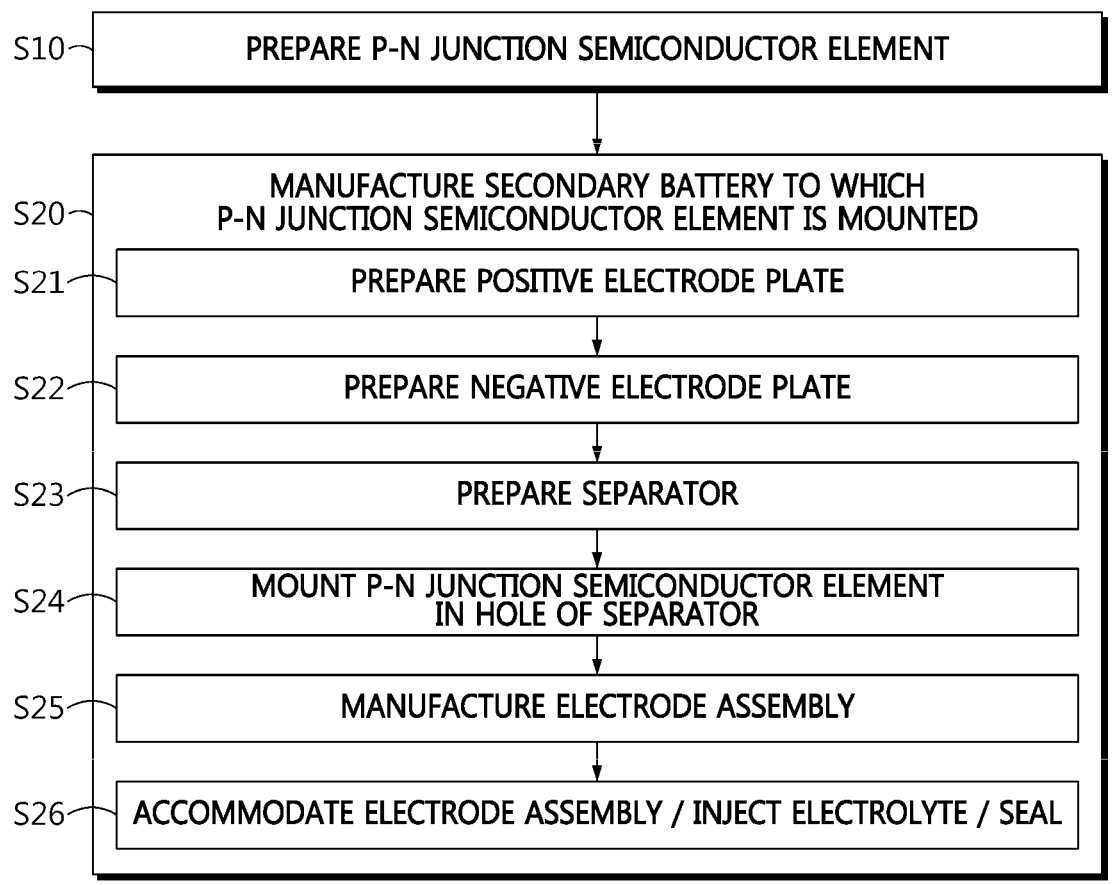
FIG. 4 is a flowchart for illustrating a method for manufacturing a secondary battery for an internal short test, which may be used to perform the method of FIG. 1.
Figure 5:
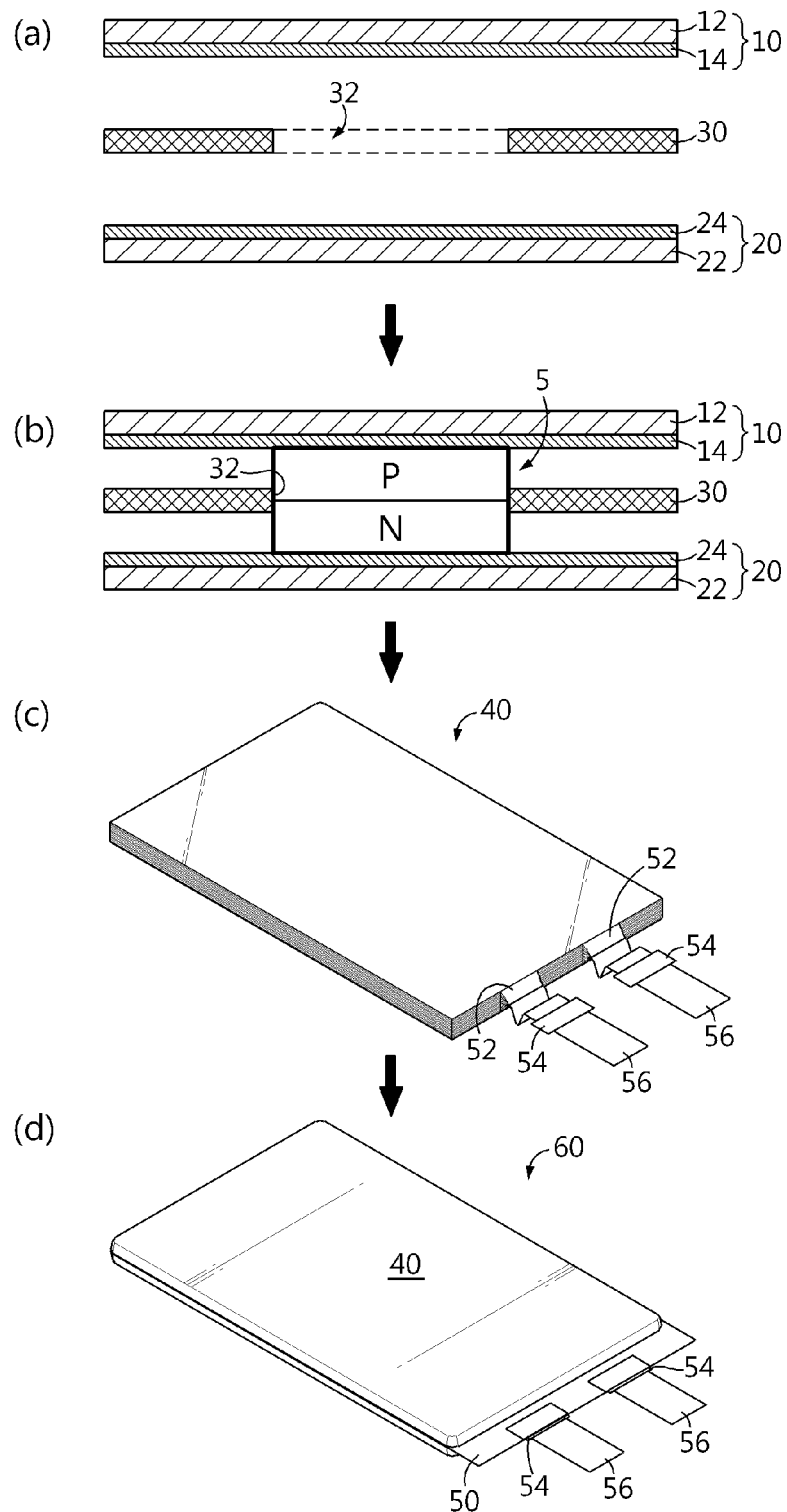
FIG. 5 is a diagram for illustrating each process step of the flowchart of FIG. 4.

FIG. 4 is a flowchart for illustrating a method for manufacturing a secondary battery for an internal short test, which may be used to perform the method of FIG. 1. FIG. 5 is a diagram for illustrating each process step of the flowchart of FIG. 4.

The secondary battery for an internal short test and a manufacturing method thereof will be described in detail with reference to FIGS. 4 and 5.

First, the P-N junction diode 5 is prepared (Step s10 of FIG. 4).

The P-N junction diode 5 may be understood from the description of the former embodiment.

Next, the secondary battery 60 for an internal short test, to which the P-N junction diode 5 is mounted, is manufactured (Step s20 of FIG. 4). This step may include detailed steps as follows.

The secondary battery is originally based on an electrode assembly manufactured by disposing a separator between a positive electrode plate and a negative electrode plate. Thus, a positive electrode plate preparing step (Step s21 of FIG. 4), a negative electrode plate preparing step (Step s22 of FIG. 4) and a separator preparing step (Step s23 of FIG. 4) are required.

Referring also to the portion (a) of FIG. 5, first, in the positive electrode plate preparing step (Step s21), the positive electrode plate 10 may be prepared by coating a positive electrode active material layer 14 including NCM, which is a lithium metal oxide containing Ni, Co and Mn, as a positive electrode active material on a positive electrode current collector 12 such as, for example, aluminum, and then drying and rolling the same.

Next, in the negative electrode plate preparing step (Step s22), the negative electrode plate 20 may be prepared by coating a negative electrode active material layer 24 containing graphite as a negative electrode active material on a negative electrode current collector 22 such as, for example, copper, and then drying and rolling the same.

The positive electrode current collector 12 and the negative electrode current collector 22 have an uncoated portion, which is not coated with an active material layer, and an electrode tab (not shown) is formed in the uncoated portion. Electrode tabs may protrude in both directions to face each other, or may protrude in one direction side by side.

The separator 30 is a porous insulating film to electrically insulate the electrode plates 10, 20 while allowing the transfer of lithium ions. In the separator preparing step (Step s23), the separator 30 may employ a sheet or nonwoven fabric made of, for example, an olefin-based polymer such as polypropylene, glass fiber or polyethylene, which has chemical-resisting and hydrophobic properties, but is not limited thereto. Preferably, the surface of the separator 30 may be coated with inorganic particles.

At this time, a hole 32 is artificially created particularly in the separator 30. The hole 32 is provided to mount the P-N junction diode 5 and is prepared in consideration of the size and mounting position of the P-N junction diode 5. A punching machine may be used to form the hole 32.

Next, after the P-N junction diode 5 is mounted inside the hole 32 as shown in the portion (b) of FIG. 5, the electrode plates 10, 20 are disposed to be placed on the upper and lower portions of the separator 30 (Step s24 of FIG. 4), such that both side surfaces of the P-N junction diode 5 are in contact with the electrode plate 10, 20, respectively. It is also important to seal the hole 32 and the P-N junction diode 5 from the periphery, so that the electrode plates 10, 20 do not directly contact each other through the hole 32 later.

After that, according to a desired design, the electrode assembly 40 is manufactured in a suitably form such as a stacked form, a folded form, a stacked-folded form, a jelly-roll form, or the like (see Step s25 of FIG. 4 and the portion (c) of FIG. 5). After that, an electrode lead 56 to which a sealing tape 54 is attached is connected to each electrode tab 52, and then the electrode assembly 40 is accommodated in an appropriate battery case 50. After an electrolyte is injected into the battery case 50, the battery case 50 is sealed, thereby completely manufacturing the secondary battery 60 for an internal short test (see Step s26 of FIG. 4 and the portion (d) of FIG. 5).

The electrode assembly 40 includes a plurality of unit cells. The unit cell has a structure in which a positive electrode plate, a separator and a negative electrode plate are stacked. Preferably, at least one of the plurality of unit cells has the structure described above (namely, the portion (b) of FIG. 5). If the electrode assembly 40 is manufactured in a jelly-roll form, the unit cell equipped with the P-N junction semiconductor element is continuously folded in one direction to have a jelly-roll structure known in the art. The method of manufacturing the electrode assembly 40 in various types is widely known in the art and thus will not described in detail here.

Although the drawings illustrate an example where the secondary battery 60 for an internal short test is manufactured in a pouch form that uses a battery case made of an aluminum laminate sheet and thermally fusing the edge of the battery case, the present disclosure is not limited thereto.

Meanwhile, the secondary battery 60 for an internal short test may include a current blocking means (for example, a fuse or a gas vent structure connected between the electrode tab and the electrode lead) to suppress the destruction of the battery even if an internal short occurs, in advance. In addition, the internal short testing method according to the present disclosure may be used to test whether the current blocking means is suitable.

On the other hand, the secondary battery 60 for an internal short test may be manufactured by performing the steps except for the steps related to the P-N junction diode 5 in Steps s21 to s26 above to completely assemble the secondary battery in the usual manner, then disassembling the secondary battery to form the hole 32 in the separator 30 so that the P-N junction diode 5 is mounted therein, and then reassembling the secondary battery. In other words, the P-N junction diode 5 may be mounted to the completed secondary battery later or after assembling or may be included from the beginning when secondary battery is assembled.

In any way, the secondary battery 60 for an internal short test manufactured as above includes the positive electrode plate 10, the negative electrode plate 20, the separator 30 interposed between the positive electrode plate 10 and the negative electrode plate 20, the P-N junction diode 5 mounted between the positive electrode plate 10 and the negative electrode plate 20 through the separator 30, and the electrode leads 56 connected to the positive electrode plate 10 and the negative electrode plate 20. In other words, the separator 30 is provided between the positive electrode plate 10 and the negative electrode plate 20 to electrically insulate the electrode plates 10, 20 from each other and maintain the electrolyte therein, and the P-N junction diode 5 is mounted between the positive electrode plate 10 and the negative electrode plate 20. In addition, the electrode leads 56 are connected to the positive electrode plate 10 and the negative electrode plate 20 of the secondary battery 60 for an internal short test through the electrode tabs 52, and the electrode leads 56 are drawn out of the battery case 50.

As mentioned above, the threshold voltage ($V_{th}$) of the P-N junction diode 5 may be, for example, a value corresponding to the full-charge voltage, for example, in a secondary battery that is to be evaluated by causing an internal short situation. In addition, the threshold voltage ($V_{th}$) of the P-N junction diode 5 may be, for example, a value corresponding to a target experimental voltage selected within the use range of the secondary battery that is to be evaluated by causing an internal short situation. If the secondary battery 60 for an internal short test is manufactured to include the P-N junction diode 5 having the threshold voltage ($V_{th}$) of a desired level, it is possible simulate the occurrence of an internal short at the instant that the P-N junction diode 5 is switched on when the battery voltage increases by charging the secondary battery 60 for an internal short test.

The method for testing an internal short of a secondary battery according to the present disclosure includes a step of charging the secondary battery 60 for an internal short test prepared as above. If the voltage of the secondary battery 60 for an internal short test corresponds to the threshold voltage ($V_{th}$) of the P-N junction diode 5 due to charging, it is considered that an internal short occurs, and thus the state of the secondary battery 60 for an internal short test may be evaluated.

FIG. 6 is a diagram showing an internal situation of the secondary battery as the secondary battery for an internal short test is charged.

For example, if the secondary battery has a full-charge voltage of 4.2V, for an internal short test at the full-charge voltage, the secondary battery 60 for an internal short test is prepared such that the threshold voltage ($V_{th}$) of the P-N junction diode 5 is 4.2V.

The portion (a) of FIG. 6 shows an initial charge state of the secondary battery 60 for an internal short test. For example, if the secondary battery 60 for an internal short test is partially charged so that its voltage rises to 3.0V, the voltage is lower than 4.2V, which is the threshold voltage ($V_{th}$) of the P-N junction diode 5. Thus, the P-N junction diode 5 is not switched on and the current does not flow through the P-N junction diode 5.

The portion (b) of FIG. 6 shows a case where the charging is continued so that the voltage of the secondary battery 60 for an internal short test reaches 4.2V, which is the full-charge voltage. At this time, since the P-N junction diode 5 is switched on by reaching 4.2 V that the threshold voltage ($V_{th}$) of the P-N junction diode 5, a one-directional current path is formed from the positive electrode plate 10 to the negative electrode plate 20, and this may be considered as an internal short situation. In this way, an internal short may be generated by simulating the actual battery use environment.

Figure 7:
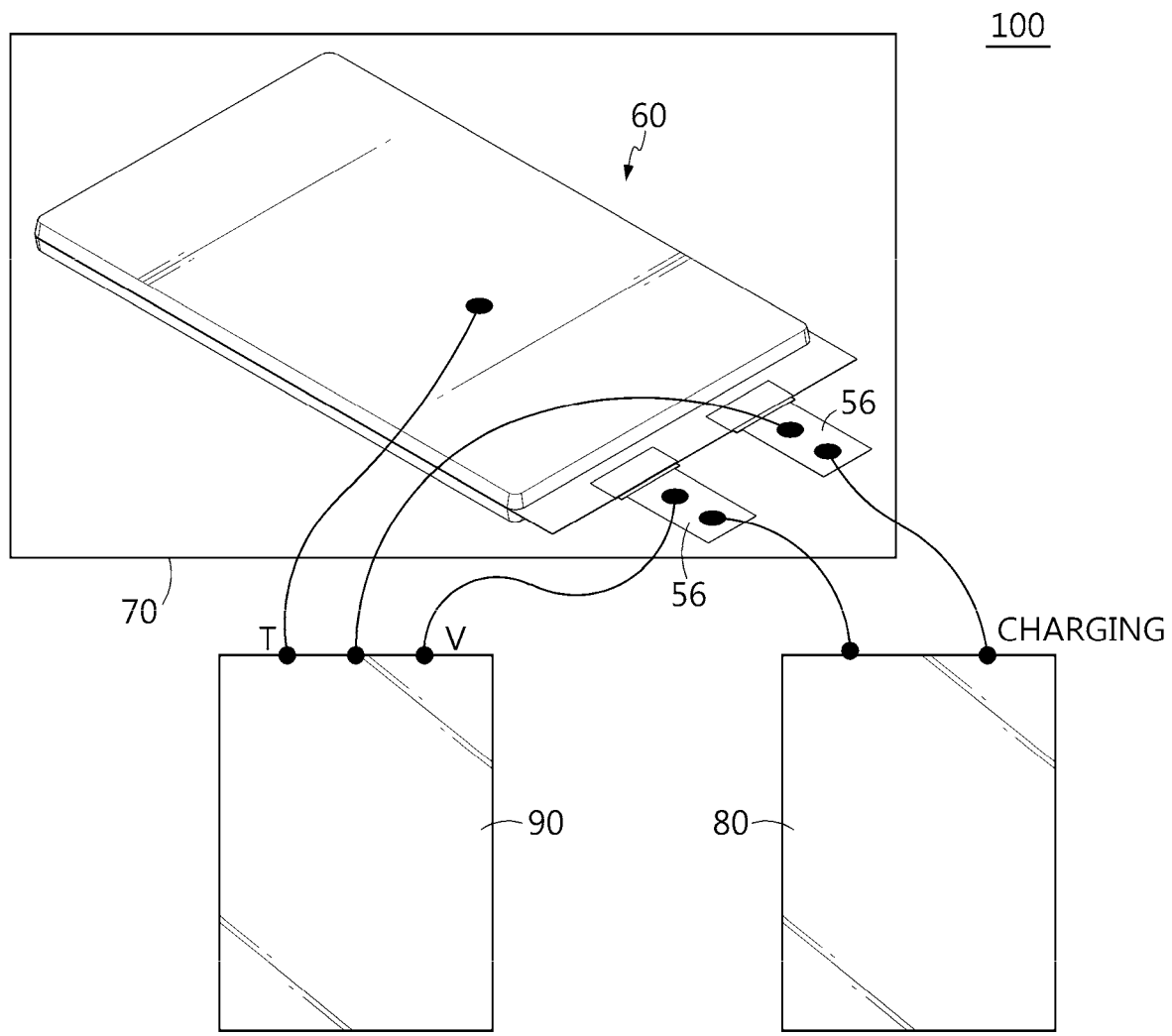
FIG. 7 is a diagram showing an apparatus for testing an internal short of a secondary battery according to an embodiment of the present disclosure.

In order to perform the method for testing an internal short of a secondary battery more appropriately, the apparatus for testing an internal short of a secondary battery as shown in FIG. 7 may be used.

Referring to FIG. 7, the apparatus 100 for testing an internal short of a secondary battery includes an explosion-proof chamber 70, a power supply 80 and a measuring instrument 90.

The explosion-proof chamber 70 allows the secondary battery 60 for an internal short test to be loaded in an inner space thereof. The explosion-proof chamber 70 may be a sample chamber with a safety door. The explosion-proof chamber 70 is provided to block the outside and the inside so as to protect a worker and the surrounding area when fire or explosion occurs at the secondary battery. If the secondary battery is exploded or toxic gas is generated according to the internal short test for the secondary battery inside the explosion-proof chamber 70, the interior of the explosion-proof chamber 70 is preferably sealed so that no toxic gas is leaked out of the explosion-proof chamber 70. It is also necessary to further provide a configuration for discharging and purifying the toxic gas. An observation window may be provided separately to allow observation to the inside, or the explosion-proof chamber 70 may be transparent partially or entirely. The size of the explosion-proof chamber 70 may be designed in consideration of a foot print of the apparatus 100 for testing an internal short of a secondary battery.

The power supply 80 is connected to the electrode lead 56 of the secondary battery 60 for an internal short test to apply a charging current. The measuring instrument 90 is connected to the electrode lead 56 of the secondary battery 60 for an internal short test to measure a voltage and also to measure a temperature of the secondary battery 60 for an internal short test.

Meanwhile, a suitable control unit (not shown) for convenient and effective operation of the power supply 80, the measuring instrument 90 and the like may be further included separately or integrally for each component. The control unit is usually a computer, which includes software for driving and controlling the components and for setting and memorizing various data values. A display means such as a monitor, a user input means such as a keyboard, and various interface devices may also be further included in the apparatus 100 for testing an internal short of a secondary battery. They may be implemented using common commercial products. For example, a monitor may be used to check information such as current test situation and test quantity, and the measuring instrument 90 may output a measured result to the control unit so that the measured result is output on the monitor.

In the internal short evaluating method using the apparatus 100 for testing an internal short of a secondary battery, the secondary battery 60 for an internal short test is loaded in the explosion-proof chamber 70. The power supply 80 is connected to the electrode lead 56 of the secondary battery 60 for an internal short test to start charging. While charging, the measuring instrument 90 is used to measure the voltage (V) and temperature (T) of the secondary battery 60 for an internal short test. If the voltage of the secondary battery 60 for an internal short test corresponds to the threshold voltage ($V_{th}$) of the P-N junction diode 5 as a result of continued charging, the internal short situation is simulated. At this time, it is checked whether the secondary battery 60 for an internal short test is exploded or fired. After the test, if the secondary battery 60 for an internal short test is stabilized, the secondary battery 60 is picked up from the explosion-proof chamber 70 and disassembled to analyze its internal components.

If the secondary battery 60 for an internal short test is not exploded or fired as a result of simulating the internal short using the P-N junction diode 5, it is determined that the secondary battery manufactured including the positive electrode plate 10, the negative electrode plate 20, the separator 30 and the electrolyte of the secondary battery 60 for an internal short test is suitable. If the secondary battery 60 for an internal short test is provided with a current blocking means or the like that may suppress the destruction of the battery even if an internal short occurs, it is determined that the current blocking means or the like has been properly operated.

On the contrary, if the secondary battery 60 for an internal short test is exploded or fired as a result of simulating the internal short, the secondary battery manufactured including the positive electrode plate 10, the negative electrode plate 20, the separator 30 and the electrolyte of the secondary battery 60 for an internal short test is not suitable. In addition, if the secondary battery 60 for an internal short test is provided with a current blocking means that may suppress the destruction of the battery even if an internal short occurs, it is determined that the current blocking means is not appropriate. Accordingly, it is determined that the elements of the secondary battery need be changed or the design conditions such as the current blocking means need to be changed, and then a suitable action is taken.

In addition, various types of safety evaluations not described here may be available in the battery design step or in the safety item evaluating step after the battery is manufactured. Also, as long as various kinds of information obtained according to the internal short testing method of the present disclosure is utilized, this should be included in the scope of the present disclosure.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

What is claimed is:

1. A method for testing an internal short of a secondary battery, comprising:
    mounting a P-N junction diode in the secondary battery such that one surface of the P-N junction diode is in contact with a positive electrode plate of the secondary battery, and an opposite surface of the P-N junction diode is in contact with a negative electrode plate of the secondary battery;
    charging the secondary battery; and
    evaluating a state of the secondary battery by checking whether an internal short occurs in the secondary battery when the P-N junction diode is switched on,
    wherein the P-N junction diode is mounted between the positive electrode plate and the negative electrode plate through a separator of the secondary battery, and
    the separator of the secondary battery comprises a hole in which the P-N junction diode is mounted.

2. The method for testing an internal short of a secondary battery according to claim 1,
    wherein the secondary battery is charged to a full-charge voltage by using the P-N junction diode having a threshold voltage ($V_{th}$) that corresponds to the full-charge voltage of the secondary battery.

3. The method for testing an internal short of a secondary battery according to claim 1,
    wherein the secondary battery is charged to an experiment target voltage in a range between a full-discharge voltage and a full-charge voltage of the secondary battery by using the P-N junction diode having a threshold voltage ($V_{th}$) that corresponds to the experiment target voltage.

4. The method for testing an internal short of a secondary battery according to claim 1, wherein the separator of the secondary battery comprises a porous insulting film.

5. The method for testing an internal short of a secondary battery according to claim 4, wherein the porous insulting film comprises polypropylene.

6. The method for testing an internal short of a secondary battery according to claim 4, wherein the porous insulting film comprises glass fiber.

7. The method for testing an internal short of a secondary battery according to claim 4, wherein the porous insulting film comprises polyethylene.

8. A secondary battery for an internal short test, comprising:
- a positive electrode plate;
- a negative electrode plate;
- a separator interposed between the positive electrode plate and the negative electrode plate;
- a P-N junction diode mounted between the positive electrode plate and the negative electrode plate through the separator; and
- electrode leads connected to the positive electrode plate and the negative electrode plate,
- wherein the P-N junction diode is mounted such that one surface of the P-N junction diode is in contact with the positive electrode plate of the secondary battery and an opposite surface of the P-N junction diode is in contact with the negative electrode plate, and the separator of the secondary battery comprises a hole in which the P-N junction diode is mounted.

9. The secondary battery for an internal short test according to claim 8, further comprising:
- a contact layer interposed between the P-N junction diode and the positive electrode plate or between the P-N junction diode and the negative electrode plate.

10. The secondary battery for an internal short test according to claim 8,
wherein the P-N junction diode has a threshold voltage ($V_{th}$) corresponding to a full-charge voltage of the secondary battery.

11. The secondary battery for an internal short test according to claim 8,
wherein the P-N junction diode has a threshold voltage ($V_{th}$) corresponding to an experiment target voltage in a range between a full-discharge voltage and a full-charge voltage of the secondary battery.

12. An apparatus for testing an internal short of a secondary battery, comprising:
- an explosion-proof chamber into which the secondary battery for an internal short test according to claim 6 is placed;
- a power supply connected to an electrode of the secondary battery for an internal short test to apply a charging current to the electrode; and
- a measuring instrument connected to the electrode to measure a voltage and configured to measure a temperature of the secondary battery.

* * * * *